United States Patent [19]
Oba et al.

[11] Patent Number: 5,694,092
[45] Date of Patent: Dec. 2, 1997

[54] VOLTAGE-CONTROLLED OSCILLATOR INCLUDING FIRST AND SECOND VARACTORS HAVING DIFFERING RATES OF CHANGE IN CAPACITANCE VALUE

[75] Inventors: Hiroaki Oba, Saitama; Shigeru Otsuka, Tokyo, both of Japan

[73] Assignee: NEC Corporation, Tokyo, Japan

[21] Appl. No.: 670,997

[22] Filed: Jun. 28, 1996

[30] Foreign Application Priority Data

Jul. 13, 1995 [JP] Japan .................................. 7-177016

[51] Int. Cl.[6] ............................................. H03B 5/12
[52] U.S. Cl. .................... 331/117 R; 331/177 V
[58] Field of Search ................... 331/117 R, 177 V, 331/36 C, 117 FE, 117 D

[56] References Cited

U.S. PATENT DOCUMENTS

| | | | |
|---|---|---|---|
| 4,609,884 | 9/1986 | Kindinger et al. | 331/177 V |
| 4,670,722 | 6/1987 | Rauscher | 331/177 V |
| 4,827,226 | 5/1989 | Connell | 331/177 V |
| 5,373,264 | 12/1994 | Higgins, Jr. | 331/117 R |

FOREIGN PATENT DOCUMENTS 3160801  7/1991  Japan .

*Primary Examiner*—David Mis
*Attorney, Agent, or Firm*—Whitham, Curtis, Whitham & McGinn

[57] ABSTRACT

A Colpitts voltage-controlled oscillator is provided with a variable capacitance section 11 connected in parallel to a resonator 12, which is the inductance element of an inductance section 1. Variable capacitance section 11 is provided with varactors X1 and X2 having differing voltage/capacitance ratios. A fixed control voltage Vc is applied to the commonly connected cathodes of varactors X1 and X2. A control voltage Va which produces a reverse bias voltage (Vc–Va) is applied to the anode of varactor X1, and a control voltage Vb which produces a reverse bias voltage (Vc–Vb) independent of control voltage Va is applied to the anode of varactor X2. When control voltage Va is fixed, control voltage Vb is made the frequency control signal, and when control voltage Vb is fixed, control voltage Va is made the frequency control signal.

13 Claims, 3 Drawing Sheets

VOLTAGE-CONTROLLED OSCILLATOR INCLUDING FIRST AND SECOND VARACTORS HAVING DIFFERING RATES OF CHANGE IN CAPACITANCE VALUE

BACKGROUND OF THE INVENTION

1. Field of the Invention

The present invention relates to a voltage-controlled oscillator for a radio device requiring a broad oscillation frequency band, and particularly to a Colpitts voltage-controlled oscillator provided with a variable capacitance section which is connected in parallel to an inductance element of a resonance circuit and which changes capacitance values, and accordingly, the oscillation frequency of the oscillator, through changes in the impressed reverse bias voltage.

2. Description of the Related Art

Most prior-art voltage-controlled oscillators of this type employ varactors for changing the capacitance value of the above-described variable capacitance section. One method designed for a voltage-controlled oscillator of broader bandwidth employs a varactor exhibiting large changes in capacitance value with respect to changes in the reverse bias voltage. However, this method has the disadvantage that the S/N ratio or C/N ratio of oscillation signals worsens due to increase in the rate of change in oscillation frequency with respect to change in the reverse bias voltage. There also exists a method by which the range of change of the reverse bias voltage impressed to the varactor is increased. In this method, however, change in capacitance with respect to change in the reverse bias voltage enters a nonlinear region in the high reverse bias voltage region of the varactor, and as a result, the range of change in oscillation frequency becomes exceedingly narrow. This method therefore entails the drawback that when such a voltage-controlled oscillator is incorporated within a synthesizer (or phase-locked loop), loop gain of the synthesizer loop (or phase-locked loop) drops.

Japanese Patent Laid-open No. 160801/91 discloses technology for a voltage-controlled oscillator that solves the above-described problems. As the above-described variable capacitance section in this voltage-controlled oscillator, a plurality of varactors are connected in parallel and reverse bias voltage is selectively impressed to each individual diode.

In the disclosed voltage-controlled oscillator described above, the problem remains that, if the reverse bias voltage impressed to the first varactor is low, and moreover, the capacitance value of this first varactor is large, change in oscillation frequency brought about by changing the reverse bias voltage impressed to the second varactor will be limited despite changes of the capacitance value by changing the reverse bias voltage impressed to the second varactor, because the capacitance value of the variable capacitance section is the sum of the capacitance values of the first and second varactors.

Furthermore, if the reverse bias voltage impressed to the first varactor is high, and moreover, the capacitance value of this first varactor is small, change in oscillation frequency will be overwhelmingly controlled by the change in capacitance value of the second varactor, and this factor complicates the method of setting reverse bias voltage to the first and second varactors used for varying oscillation frequency over a broad range.

SUMMARY OF THE INVENTION

The object of the present invention is to provide a voltage-controlled oscillator that solves the above-described problems of the prior art and that further allows easy control as well as oscillation frequencies over a broad range.

The voltage-controlled oscillator according to the present invention is a Colpitts voltage-controlled oscillator composed of an inductance element and a variable-capacitance section that is connected in parallel with the inductance element and that varies capacitance value, and accordingly, the oscillation frequency of output signals, through changes in the impressed reverse bias voltage; the variable-capacitance section being provided with a first varactor and a second varactor having mutually connected cathodes and mutually differing rates of change in capacitance value with respect to change in reverse bias voltage; wherein a fixed control voltage is impressed to the cathodes, a first control voltage that gives a reverse bias voltage to the first varactor is impressed to the anode of the first varactor, and a second control voltage that gives a reverse bias voltage to the second varactor that is independent of the first control voltage is impressed to the anode of the second varactor.

A voltage-controlled oscillator of the present invention can be constituted such that a transistor is the oscillation element, the base of this transistor is grounded, the inductance element is a resonator having a resonance frequency in the vicinity of the oscillation frequency of this voltage-controlled oscillator and is connected to the collector of the transistor.

Another voltage-controlled oscillator of the present invention can be constituted such that the first control voltage and the second control voltage can each be set between predetermined prescribed voltages; wherein when the first control voltage is varied, the second control voltage is fixed to a voltage that gives the maximum reverse bias voltage allowed by the second varactor; and when the second control voltage is varied, the first control voltage is fixed to a voltage that gives the maximum reverse bias voltage allowed by the first varactor.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

The present invention will next be explained with reference to the accompanying figures.

Figure 1:
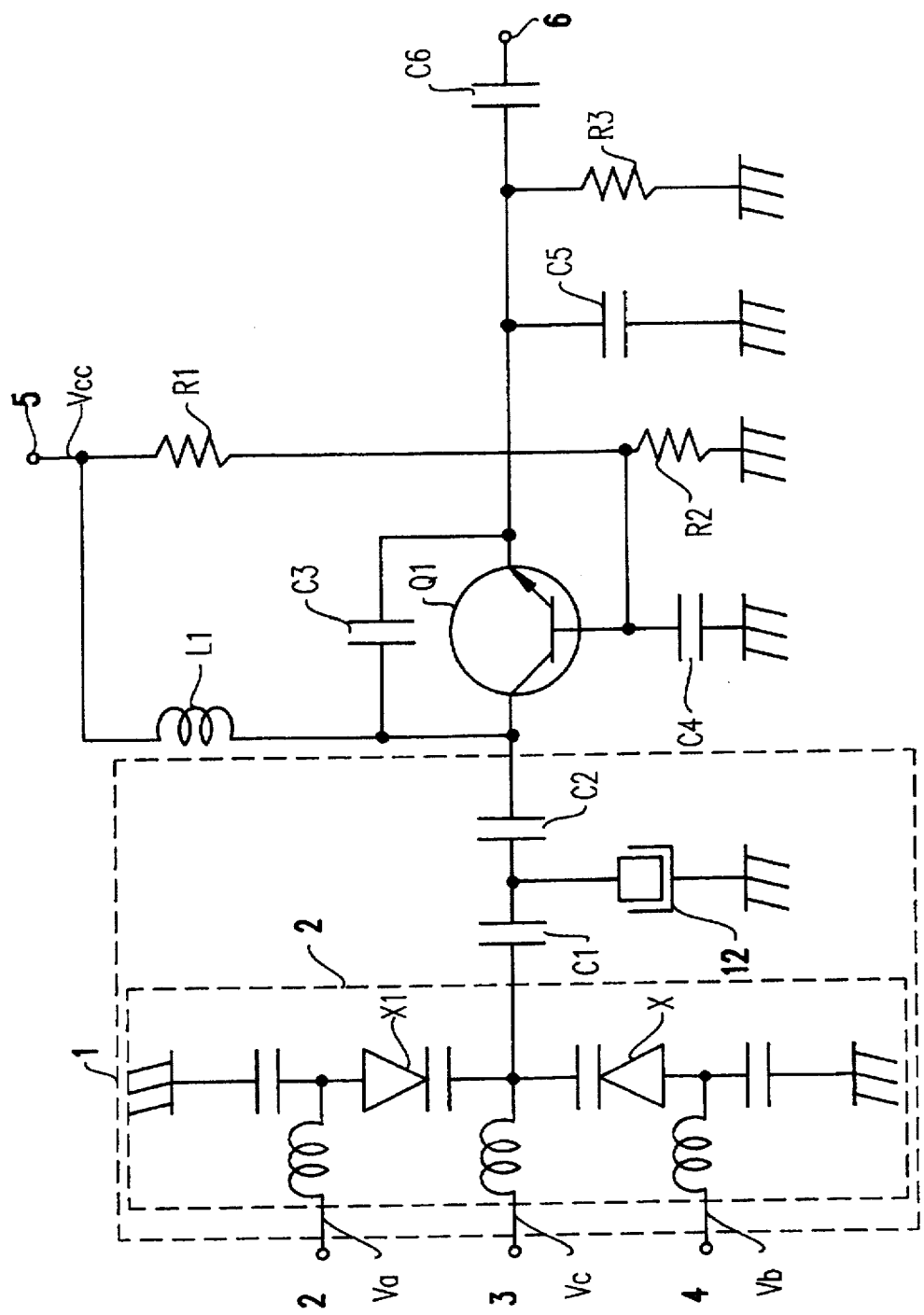
FIG. 1 is circuit diagram showing the configuration of one embodiment of a voltage-controlled oscillator according to the present invention.

In FIG. 1, this voltage-controlled oscillator is a Colpitts oscillator in which transistor Q1 is an active element and the base of transistor Q1 is grounded at capacitor C4. Capacitor C3 is connected between the collector and emitter of transistor Q1, capacitor C5 is connected between the emitter and base of transistor Q1, and inductance section 1 which indicates overall inductive impedance is connected between the collector and base of transistor Q1. Power-supply voltage Vcc is supplied from power source terminal 5 to the collector of transistor Q1 by way of coil L1 for preventing leakage of oscillation signals, the voltage of power-source voltage Vcc voltage-divided by resistors R1 and R2 is supplied to the base, and the emitter is grounded by way of resistor R3 for auto-bias use. The output signals of this voltage-controlled oscillator pass from the emitter of transistor Q1 through capacitor C6 and are outputted to output terminal 6.

Inductance section 1 is provided with resonator 12 that operates as an inductance element that indicates inductive impedance in the oscillation frequency of this voltage-controlled oscillator, and variable capacitance section 11 which is connected in parallel with this resonator 12. Variable capacitance section 11 varies capacitance values in response to control voltage Va impressed to control terminal 2, control voltage Vc impressed to control terminal 3, and control voltage Vb impressed to control terminal 4, and thus varies the oscillation frequency of the voltage-controlled oscillator in accordance with these capacitance value changes. For example, the capacitance value of variable capacitance section 11 makes the oscillation frequency of this voltage-controlled oscillator lower than the resonance frequency of resonator 12, and the oscillation frequency is further decreased with increases in the capacitance value of this variable capacitance section 11. Capacitors C1 and C2 both prevent flow of direct current between variable-capacitance section 11 and resonator 12 as well as between resonator 12 and the collector of transistor Q1. Capacitors C1 and C2 are furthermore coupling capacitors that pass on the oscillation signal component and exhibit substantially 0 impedance with respect to the oscillation frequency. In addition, a resonator having a high Q such as a crystal resonator or a dielectric resonator is generally employed as resonator 12, but a resonator of relatively low Q such as a strip line resonator may also be used.

Variable-capacitance section 11 is provided with control terminals 2, 3, and 4 as input terminals and varactors X1 and X2 which have cathodes mutually connected to capacitor C1.

Figure 2:
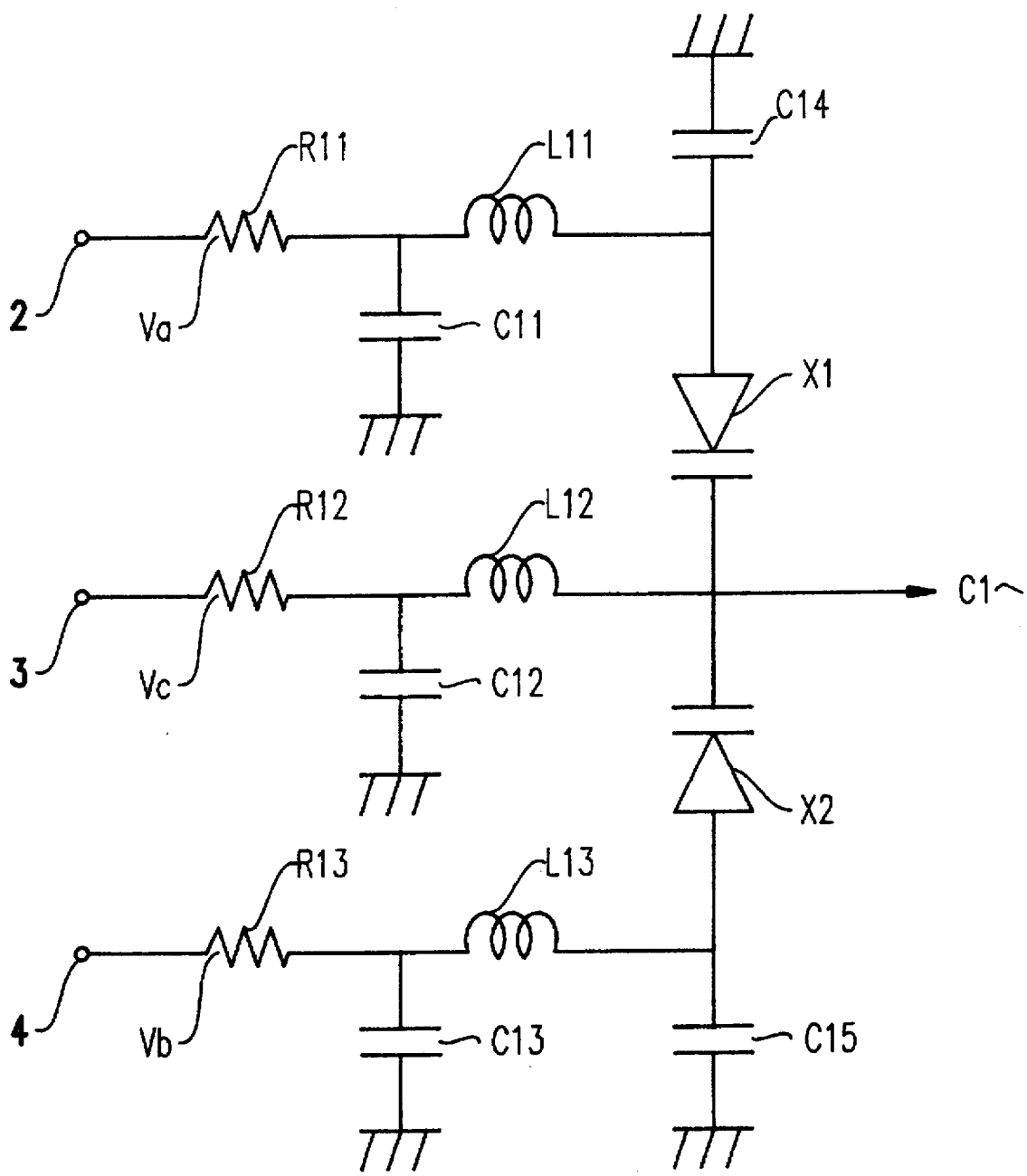
FIG. 2 is a detailed circuit diagram showing the variable-capacitance section of FIG. 1.

As shown in the detailed circuit diagram of FIG. 2, variable-capacitance section 11, resistor R11 and coil L11 are serially connected between control terminal 2 and the anode of varactor X1, capacitor C11 is connected between the ground potential and the node of resistor R11 and coil L11, and capacitor C14 is connected between the ground potential and the anode of diode X1. Resistor R11 and capacitor C11 function as a filter for removing high-frequency signals contained within control voltage Va supplied to control terminal 2, and coil L11 is a choke coil that prevents leakage of oscillation signals to control terminal 2. Capacitor C14 by-passes oscillation signals and grounds the anode of varactor X1.

Resistor R12 and coil L12 are serially connected between control terminal 3 and the cathodes of varactors X1 and X2, and capacitor C12 is connected between the ground potential and the node of resistor R12 and coil L12. In addition, resistor R13 and coil L 13 are serially connected between control terminal 4 and the anode of varactor X2, capacitor C13 is connected between the ground potential and the node of resistor R13 and coil L13, and capacitor C15 is connected between the ground potential and the anode of varactor X2. Resistor R12 and capacitor C12 function as a filter that removes high-frequency signals contained in control voltage Vc supplied to control terminal 3, and resistor R13 and capacitor C13 function as a filter that removes high-frequency signals contained in control voltage Vb supplied to control terminal 4. Coils L12 and L13 are choke coils that prevent leakage of oscillation signals to control terminal 3 and 4, respectively. Capacitor C15 grounds the anode of varactor X2.

The rate of change of capacitance values with respect to changes in impressed reverse bias voltage differs in varactors X1 and X2. A fixed control voltage Vc is impressed to control terminal 3, a control voltage Va that gives a reverse bias voltage to varactor X1 is impressed to control terminal 2, and a control voltage Vb giving a reverse bias voltage to varactor X2 is impressed to control terminal 4. Moreover, control voltages Va and Vb are impressed independent of each other.

Figure 3:
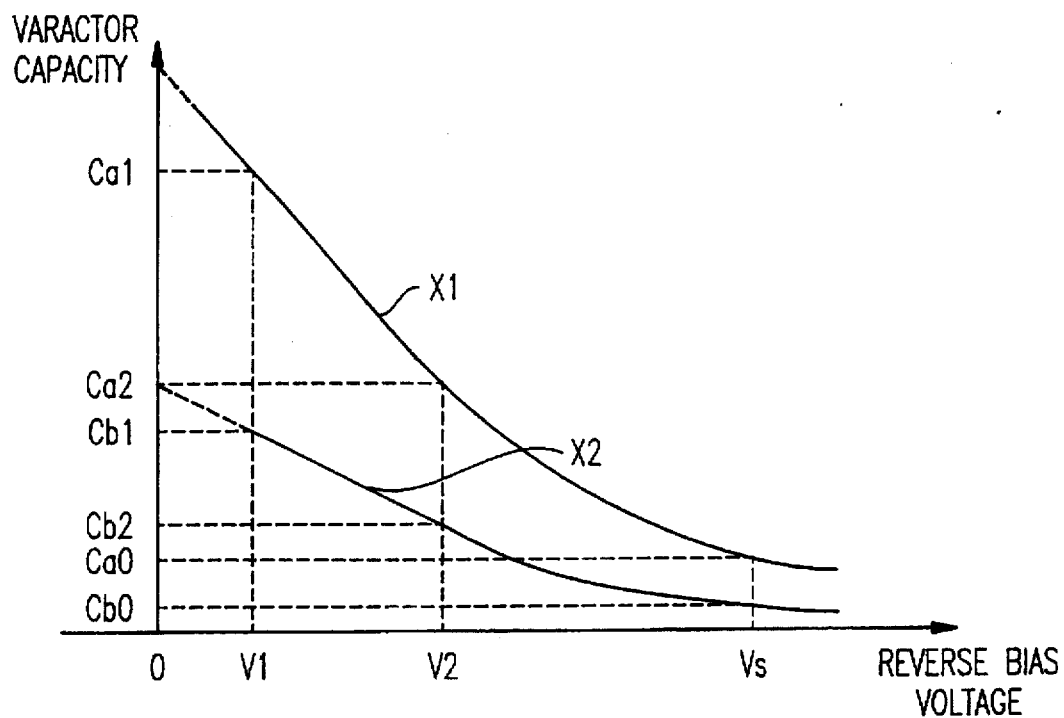
FIG. 3 shows the capacitance value characteristics with respect to reverse bias voltage for varactors X1 and X2 used in the configuration of the present embodiment.

As shown in FIG. 3, as the reverse bias voltages at varactors X1 and X2 increase, the capacitance values decrease. The rate of change in capacitance with respect to change in reverse bias voltage for varactor X1 is twice that of varactor X2. Varactor X1 indicates capacitance value Ca0 at reverse bias voltage Vs, which approaches the maximum reverse bias voltage that can be impressed, and indicates gradually increasing capacitance value Ca2 and capacitance value Ca1 at gradually decreasing reverse bias voltages V2 and V1, respectively. Varactor X2, on the other hand, indicates capacitance value Cb0 at reverse bias voltage Vs, which approaches the maximum reverse bias voltage that can be impressed, and indicates gradually increasing capacitance value Cb2 and capacitance value Cb1 at gradually decreasing reverse bias voltages V2 and V1, respectively. Furthermore, reverse bias voltages V1 and V2 are selected such that the change characteristic curve of FIG. 3 is substantially linear in the range defined by reverse bias voltage V1 and V2, and within this range of reverse bias voltage, the oscillation frequency of the voltage-controlled oscillator can be easily varied linearly with respect to the reverse bias voltage impressed to varactors X1 and X2. Over the range of change in capacitance for varactor X1 and varactor X2 within the above-described identical range of reverse bias voltage, the rate of change in capacitance with respect to the change in voltage naturally differs for each of the diodes.

Figure 4:
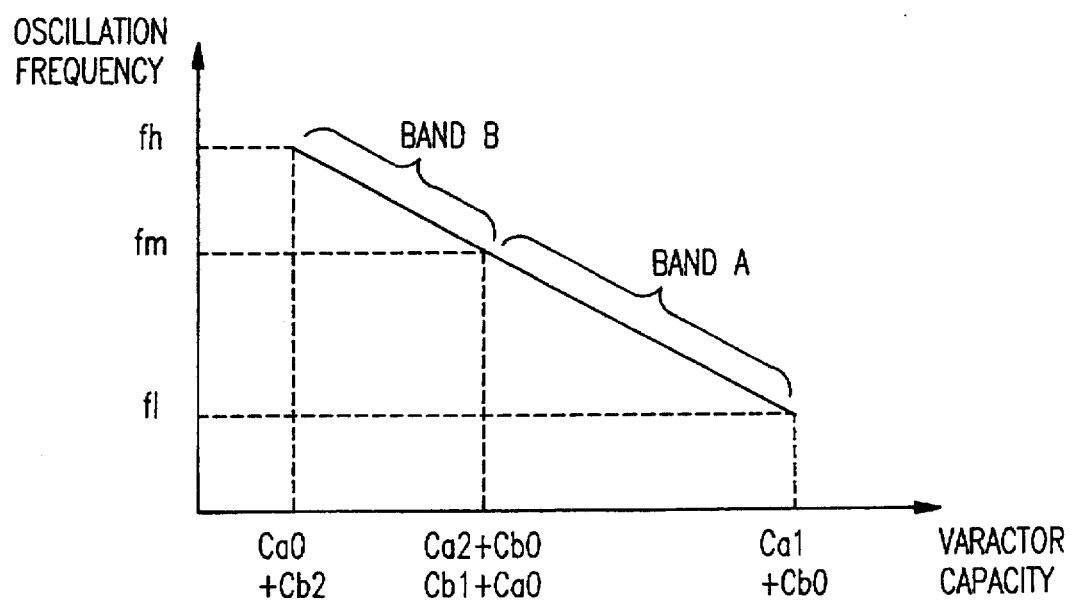
FIG. 4 shows the relation between oscillation frequency and the capacitance value of the varactors in the configuration of the present embodiment.

Referring to FIGS. 1, 3 and 4, in a voltage-controlled oscillator of the configuration of this embodiment, the types of varactor X1 and X2 and the reverse bias voltages V1, V2, and Vs are set such that capacitance value (Ca2+Cb0)= capacitance value (Cb1+Ca0). Such a voltage-controlled oscillator features oscillation frequency that decreases with increase in the capacitance value of variable-capacitance section 11, and therefore, the oscillation frequencies corresponding to each of the capacitance values (Ca1+Cb0), (Ca2+Cb0=Cb1+Ca0), and (Ca0+Cb2) of variable-capacitance section 11 are fl, fm, and fh, respectively, in order of increasing size. In other words, if the reverse bias voltage of varactor X2 is fixed at Vs and the reverse bias voltage of varactor X1 is varied from V1 to V2, the oscillation frequency varies from frequency fl to frequency fm contained within band A. Furthermore, if the reverse bias voltage of varactor X1 is fixed at Vs and the reverse bias voltage of varactor X2 is varied from V1 to V2, the oscillation frequency varies from frequency fm to frequency fh contained within band B.

In a voltage-controlled oscillator configured according to the present invention, the high-frequency impedance of capacitors C1 and C2 is not necessarily 0, and the voltage-controlled oscillator may be influenced by capacitance between the cases of varactors X1 and X2 as well as by factors such as floating capacitance not shown in the figures. Accordingly, it must be noted that the characteristics of the oscillation frequency of the voltage-controlled oscillator with respect to the capacitance values of varactors X1 and X2 shown in FIG. 4 idealize the characteristics of the circuit shown in FIG. 1, and are the ideal characteristics when varactors X1 and X2 exhibit the characteristics shown in FIG. 3. In establishing the detailed design of such a voltage-controlled oscillator, therefore, varactors X1 and X2 as well as the reverse bias voltage impressed to varactors X1 and X2 must be determined with due consideration given to such factors as capacitance between the above-described cases and floating capacitance.

In the configuration of the present embodiment, the above-described reverse bias voltage is impressed to varactors X1 and X2 according to the following chart:

| Control voltage Vc | Control voltage Va | Control voltage Vb | Oscillation frequency | Band |
|---|---|---|---|---|
| Vs | Vs−V1 | 0 V | fl | A |
| Vs | Vs−V2 | 0 V | fm | A |
| Vs | 0 V | Vs−V1 | fn | B |
| Vs | 0 V | Vs−V2 | fh | B |

In other words, a fixed voltage Vs that is equal to the above-described reverse bias voltage Vs is constantly impressed to control terminal 3 as control voltage Vc. To obtain oscillation signals within the range of band A, control Voltage Vb impressed to control terminal 4 is fixed at 0 V, and control voltage Va impressed to control terminal 2 is set to a voltage that gives a reverse bias voltage between V1 and V2 to varactor X1, i.e., a voltage from (Vs−V1) to (Vs−V2). Similarly, to obtain oscillation signals in the range of band B, control voltage Va impressed to control terminal 2 is fixed at 0 V, and control voltage Vb impressed to control terminal 4 is set to a voltage that gives a reverse bias voltage between V1 and V2 to varactor X2, i.e., a voltage from (Vs−V1) to (Vs−V2).

Furthermore, the values of the above-described voltages Vs, V1 and V2 are crucial in determining the reverse bias voltages impressed to varactors X1 and X2, and control voltages Va, Vb and Vc can of course be freely modified as long as they satisfy these voltage values. In addition, the reverse bias voltages Vs impressed to varactors X1 and X2 can obviously each be set to differing values according to the characteristics of varactors X1 and X2.

A voltage-controlled oscillator according to the above-described embodiment provides the effect of allowing the generation of oscillation signals over a broad band including differing bands A and B and moreover, having a control voltage-to-oscillation frequency relation of good linearity even if the same variable control voltage from voltage (Vs−V1) to (Vs−V2) is impressed. This effect primarily results from the employment of varactors X1 and X2 having differing rates of change in capacitance with respect to changes in reverse bias voltage. This effect is secondarily the result of independently controlling the reverse bias voltage of varactors X1 and X2. Furthermore, such a voltage-controlled oscillator has the effect of allowing variation of oscillation frequency over a broad band at relatively low control voltages Va and Vb ranging from voltage (Vs−V1) to voltage (Vs−V2).

An example of the fabrication of a voltage-controlled oscillator which takes as its basic circuit the configuration of the embodiment of FIG. 1 will next be explained. This voltage-controlled oscillator is a 900-MHz band oscillator employing a 2SC4266 transistor (NEC) for transistor Q1, an MA331 varactor (a Hitachi-made varactor having CaO on the order of 5.8 pF and a maximum reverse voltage Vr of 12 V) for varactor X1, and an HVU352 varactor (a Hitachi-made varactor having CbO on the order of 1.8 pF and a maximum reverse voltage Vr of 12 V) for varactor X2. Resonator 12 employs a ceramic having a dielectric constant on the order of 90 as a resonator element, and has a resonance frequency on the order of 2.0 GHz. Accordingly, a capacitor is additionally connected to resonator 12 to decrease the oscillation frequency of the voltage-controlled oscillator.

Varactors X1 and X2 are set such that voltage V1=0.7 V, voltage V2=4.0 V, voltage Vs=10 V; and are operated by applying reverse bias voltage. Control voltage Vc is fixed at 10 V and applied to control terminal 3. When being operated in band A, control voltage Vb applied to control terminal 4 is fixed at 0 V, and control voltage Va applied to control terminal 2 is varied between 6 V and 9.3 V. When being operated in band B, control voltage Va applied to control terminal 2 is fixed at 0 V, and control voltage Vb applied to control terminal 4 is varied between 6 V and 9.3 V. Under these set conditions, the lower-limit frequency fl of band A is 892 MHz, the upper-limit frequency of band B is 916 MHz, and the overlapping midpoint frequency fm at the upper-limit area of band A and the lower-limit area of band B is 908 MHz.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A voltage-controlled oscillator comprising:

an inductance element; and a variable-capacitance section connected in parallel with said inductance element, for varying a capacitance value, and accordingly, an oscillation frequency of output signals, through changes in impressed reverse bias voltage, wherein said variable-capacitance section comprises a first varactor and a second varactor having mutually connected cathodes and differing rates of change in capacitance value with respect to a change in reverse bias voltage, and wherein a predetermined control voltage is impressed to said cathodes, a first control voltage providing a reverse bias voltage to said first varactor is impressed to the anode of said first varactor, and a second control voltage providing a reverse bias voltage to said second varactor that is independent of said first control voltage is impressed to the anode of said second varactor.

2. A voltage-controlled oscillator according to claim 1, wherein said voltage-controlled oscillator further includes a transistor as an oscillation element and the base of said transistor is grounded, and wherein said inductance element comprises a resonator having a resonance frequency in the vicinity of the oscillation frequency of said voltage-controlled oscillator and is connected to the collector of said transistor.

3. A voltage-controlled oscillator according to claim 1, wherein the control voltages of said first control voltage and second control voltage are settable between predetermined prescribed voltages, wherein, when said first control voltage is varied between prescribed set voltages, said second control voltage is fixed to a voltage that gives a maximum reverse bias voltage allowed by said second varactor; and wherein, when said second control voltage is varied between prescribed set voltages, said first control voltage is fixed to a voltage that gives a maximum reverse bias voltage allowed by said first varactor.

4. A voltage-controlled oscillator according to claim 1, wherein said voltage-controlled oscillator comprises a Colpitts voltage-controlled oscillator.

5. A voltage-controlled oscillator, comprising:

an inductance element; and a variable-capacitance section connected in parallel with said inductance element, for varying a capacitance value, and accordingly, an oscillation frequency of output signals, through changes in impressed reverse bias voltage, wherein said variable-capacitance section comprises a first varactor and a second varactor having mutually connected cathodes and differing rates of change in capacitance value with respect to a change in reverse bias voltage.

6. A voltage-controlled oscillator according to claim 5, wherein a predetermined control voltage is impressed to said cathodes, a first control voltage providing a reverse bias voltage to said first varactor is impressed to the anode of said first varactor, and a second control voltage providing a reverse bias voltage to said second varactor is impressed to the anode of said second varactor.

7. A voltage-controlled oscillator according to claim 6, wherein said second control voltage, providing said reverse bias voltage to said second varactor, is independent of said first control voltage.

8. A voltage-controlled oscillator according to claim 5, wherein said voltage-controlled oscillator comprises a Colpitts voltage-controlled oscillator.

9. A voltage-controlled oscillator according to claim 5, wherein said voltage-controlled oscillator further includes a transistor as an oscillation element and the base of said transistor is grounded.

10. A voltage-controlled oscillator according to claim 9, wherein said inductance element comprises a resonator having a resonance frequency in the vicinity of the oscillation frequency of said voltage-controlled oscillator and is connected to the collector of said transistor.

11. A voltage-controlled oscillator according to claim 6, wherein the control voltages of said first control voltage and second control voltage are settable between predetermined prescribed voltages.

12. A voltage-controlled oscillator according to claim 11, wherein, when said first control voltage is varied between prescribed set voltages, said second control voltage is fixed to a voltage that gives a maximum reverse bias voltage allowed by said second varactor.

13. A voltage-controlled oscillator according to claim 12, wherein, when said second control voltage is varied between prescribed set voltages, said first control voltage is fixed to a voltage that gives a maximum reverse bias voltage allowed by said first varactor.

* * * * *